US011244993B2

(12) United States Patent
Chang et al.

(10) Patent No.: US 11,244,993 B2
(45) Date of Patent: *Feb. 8, 2022

(54) FLEXIBLE ORGANIC LIGHT-EMITTING DISPLAY DEVICE AND METHOD OF MANUFACTURING THE SAME

(71) Applicant: Samsung Display Co., Ltd., Yongin-si (KR)

(72) Inventors: Moonwon Chang, Yongin-si (KR); Seunghun Kim, Yongin-si (KR); Wooyong Sung, Yongin-si (KR); Seungyong Song, Yongin-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/891,783

(22) Filed: Jun. 3, 2020

(65) Prior Publication Data
US 2020/0295106 A1    Sep. 17, 2020

Related U.S. Application Data

(63) Continuation of application No. 15/602,005, filed on May 22, 2017, now Pat. No. 10,714,551.

(30) Foreign Application Priority Data

Dec. 5, 2016    (KR) .................. 10-2016-0164383

(51) Int. Cl.
  *H01L 27/32*    (2006.01)
  *H01L 51/00*    (2006.01)
(Continued)

(52) U.S. Cl.
  CPC ...... *H01L 27/3248* (2013.01); *H01L 27/1218* (2013.01); *H01L 27/1225* (2013.01);
(Continued)

(58) Field of Classification Search
  CPC ............. H01L 27/3248; H01L 27/1218; H01L 27/1225; H01L 27/1248; H01L 27/1262;
(Continued)

(56) References Cited

U.S. PATENT DOCUMENTS 10,361,312 B2    7/2019 Jung et al.
2005/0003655 A1*    1/2005 Cathey .............. H01L 21/76834
                                                          438/627

(Continued)

FOREIGN PATENT DOCUMENTS

KR    10-2016-0059053    5/2016
KR    10-2016-0062329    6/2016
(Continued)

OTHER PUBLICATIONS

Non-Final Office Action dated Jun. 1, 2018, in U.S. Appl. No. 15/602,005.
(Continued)

*Primary Examiner* — Mohsen Ahmadi
(74) *Attorney, Agent, or Firm* — H.C. Park & Associates, PLC (57) ABSTRACT

Provided are a flexible organic light-emitting display device and a method of manufacturing the same. The flexible organic light-emitting display device includes a metal oxide infiltrated layer as part of at least one of a plurality of organic layers stacked on and around an organic light-emitting device.

17 Claims, 6 Drawing Sheets

(51) Int. Cl.
- *H01L 27/12* (2006.01)
- *H01L 51/52* (2006.01)
- *H01L 51/56* (2006.01)
- *H01L 29/786* (2006.01)
- *H01L 29/24* (2006.01)
- *H01L 51/05* (2006.01)
- *H01L 51/50* (2006.01)
- *H01L 51/10* (2006.01)

(52) U.S. Cl.
CPC ...... *H01L 27/1248* (2013.01); *H01L 27/1262* (2013.01); *H01L 27/3262* (2013.01); *H01L 29/7869* (2013.01); *H01L 29/78603* (2013.01); *H01L 51/0097* (2013.01); *H01L 51/5253* (2013.01); *H01L 51/56* (2013.01); *H01L 27/3246* (2013.01); *H01L 27/3258* (2013.01); *H01L 29/24* (2013.01); *H01L 51/0508* (2013.01); *H01L 51/107* (2013.01); *H01L 51/5012* (2013.01); *H01L 51/5237* (2013.01); *H01L 2227/323* (2013.01); *H01L 2251/303* (2013.01); *H01L 2251/5338* (2013.01)

(58) Field of Classification Search
CPC ............. H01L 27/3262; H01L 27/3246; H01L 27/3258; H01L 51/0097; H01L 51/5253; H01L 51/5012; H01L 51/5237
See application file for complete search history.

(56) References Cited

U.S. PATENT DOCUMENTS

| | | |
|---|---|---|
| 2007/0273280 A1 | 11/2007 | Kim et al. |
| 2010/0062555 A1 | 3/2010 | Hwang et al. |
| 2011/0127499 A1 | 6/2011 | Yoon et al. |
| 2011/0248276 A1 | 10/2011 | Son et al. |
| 2012/0326194 A1 | 12/2012 | Son et al. |
| 2013/0092972 A1 | 4/2013 | Kim et al. |
| 2014/0023840 A1 | 1/2014 | Shibayama et al. |
| 2015/0035431 A1* | 2/2015 | Lee ................... H01L 51/5256 313/504 |
| 2015/0102324 A1 | 4/2015 | Lee |
| 2015/0144930 A1 | 5/2015 | Kim et al. |
| 2016/0141551 A1 | 5/2016 | Seo et al. |
| 2016/0148955 A1 | 5/2016 | Hong et al. |
| 2016/0148984 A1 | 5/2016 | Kim et al. |
| 2016/0164026 A1 | 6/2016 | Kim et al. |
| 2016/0190511 A1* | 6/2016 | Choi ................. H01L 51/5253 257/40 |
| 2016/0209955 A1 | 7/2016 | Kim et al. |
| 2017/0141313 A1 | 5/2017 | Min |
| 2017/0141354 A1 | 5/2017 | Bonnet et al. |
| 2017/0338433 A1 | 11/2017 | Ishii et al. |
| 2018/0019438 A1 | 1/2018 | Kim et al. |
| 2018/0040854 A1 | 2/2018 | Sung et al. |

FOREIGN PATENT DOCUMENTS

| | | |
|---|---|---|
| KR | 10-2016-0063484 | 6/2016 |
| KR | 10-2016-0069073 | 6/2016 |
| KR | 10-2016-0089946 | 7/2016 |
| WO | WO2016005456 | 1/2016 |

OTHER PUBLICATIONS

Final Office Action dated Nov. 28, 2018, in U.S. Appl. No. 15/602,005.
Non-Final Office Action dated Sep. 13, 2019, in U.S. Appl. No. 15/602,005.
Notice of Allowance dated Mar. 5, 2020, in U.S. Appl. No. 15/602,005.

* cited by examiner

FLEXIBLE ORGANIC LIGHT-EMITTING DISPLAY DEVICE AND METHOD OF MANUFACTURING THE SAME

CROSS-REFERENCE TO RELATED APPLICATION

This application is a Continuation of U.S. patent application Ser. No. 15/602,005, filed on May 22, 2017, now issued as U.S. Pat. No. 10,714,551, and claims priority from and the benefit of Korean Patent Application No. 10-2016-0164383, filed on Dec. 5, 2016, each of which is hereby incorporated by reference for all purposes as if fully set forth herein.

BACKGROUND

Field

Exemplary embodiments relate to flexible organic light-emitting display devices. More particularly, exemplary embodiments relate to an organic light-emitting display device having an improved structure for preventing infiltration of oxygen or moisture, and a method of manufacturing the organic light-emitting display device.

Discussion of the Background

General flexible organic light-emitting display devices include a display unit on a flexible substrate, and thus, a panel of the display unit is bendable and may have a moderate curvature if necessary. The display unit includes an organic light-emitting device having an emission layer formed of an organic material between an anode and a cathode. When voltages are respectively applied to the anode and the cathode, holes injected into the anode and electrons injected into the cathode recombine in the emission layer to generate excitons. When the excitons fall from an excited state to a ground state, light emission occurs, and an image is generated.

However, when the emission layer of the display unit contacts moisture or oxygen, emitting properties immediately degrade, and thus a structure for preventing this degradation is required. Accordingly, several inorganic layers, each acting as a barrier layer, need to be further formed. In this case, flexible organic light-emitting display devices become thicker, and the flexibility thereof may decrease. Thus, the transformation capability of flexible organic light-emitting display devices is sharply reduced.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible organic light-emitting display device capable of smoothly preventing infiltration of moisture and oxygen while maintaining a moderate level of flexibility, and a method of manufacturing the flexible organic light-emitting display device.

Additional aspects will be set forth in the detailed description which follows, and, in part, will be apparent from the disclosure, or may be learned by practice of the inventive concept.

According to exemplary embodiments, a flexible organic light-emitting display device includes an organic light-emitting device; a plurality of organic layers stacked on and around the organic light-emitting device; and a metal oxide infiltrated layer as part of at least one of the plurality of organic layers.

According to one or more embodiments, a method of manufacturing a flexible organic light-emitting display device includes stacking a plurality of organic layers on and around an organic light-emitting device; and forming a metal oxide infiltrated layer as part of at least one of the plurality of organic layers utilizing a sequential vapor deposition method.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
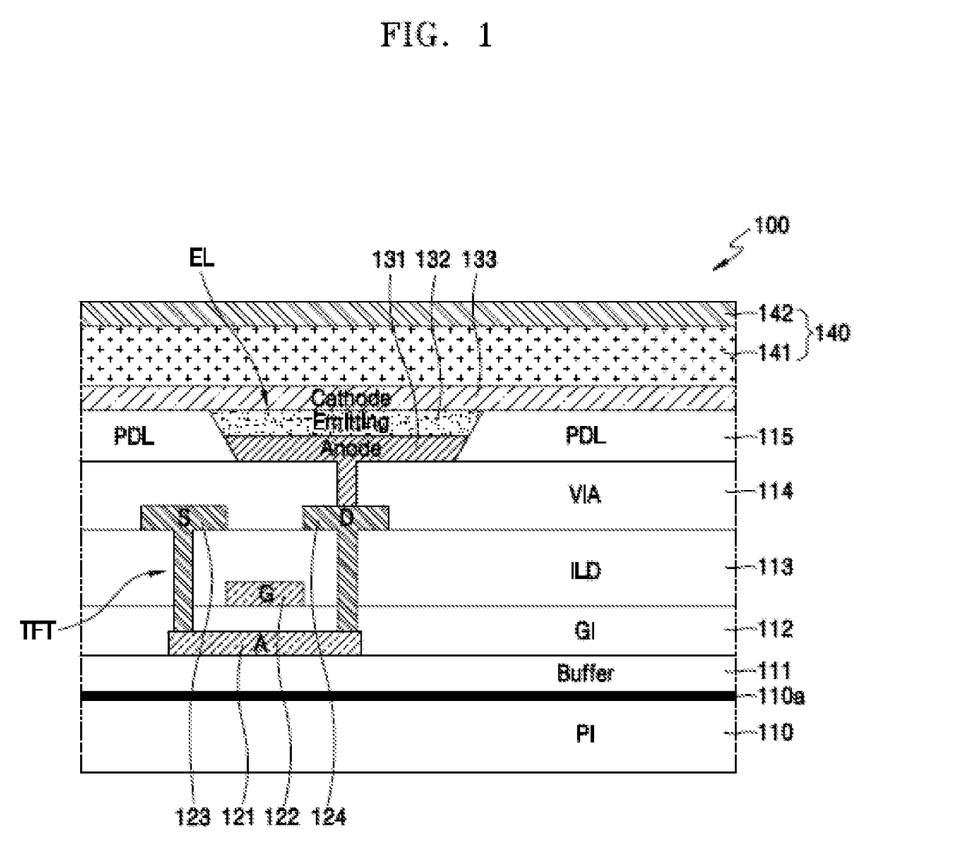
FIG. 1 is a cross-sectional view of a flexible organic light-emitting display according to an exemplary embodiment.

FIG. 1 is a cross-sectional view of a flexible organic light-emitting display device according to an exemplary embodiment.

The flexible organic light-emitting display device according to the present exemplary embodiment may include a flexible panel 100 capable of being bent. The flexible panel 100 may be a structure in which a thin film transistor TFT and an organic light-emitting device EL for realizing an image. An encapsulation layer 140 that covers and protects the thin film transistor TFT and the organic light-emitting device EL may be stacked on a flexible base organic layer 110. Because the flexible base organic layer 110, which is a flexible substrate, is used instead of a rigid glass substrate, the flexible panel 100 may be bent or rolled. The base organic layer 110 may be formed using polyimide.

An active layer 121 of the thin film transistor TFT may be formed on a buffer layer 111 that is adjacent to the base organic layer 110, and source and drain regions doped with N-type or P-type impurities at a high concentration may be formed on both ends of the active layer 121, respectively. The active layer 121 may include an oxide semiconductor. The oxide semiconductor may include an oxide of a material selected from the group consisting of Group 4, 12, 13, and 14 metal elements (such as, zinc (Zn), indium (In), gallium (Ga), stannum (Sn), cadmium (Cd), germanium (Ge), and hafnium (Hf)), and a combination thereof. The active layer 121 may include G-I-Z-O $[(In_2O_3)_a(Ga_2O_3)_b(ZnO)_c]$, wherein a, b, and c are real numbers that respectively satisfy a≥0, b≥0, and c>0. A gate electrode 122 is formed over the active layer 121 with a gate insulating layer 112 between the gate electrode 122 and the active layer 121. A source electrode 123 and a drain electrode 124 may be formed over the gate electrode 122, and the source electrode 123 and the drain electrode 124 may be respectively connected to the source and drain regions of the active layer 121. An interlayer insulating layer 113 may be included between the gate electrode 122 and each of the source electrode 123 and the drain electrode 124, and a via layer 114 may be interposed between an anode 131 of the organic light-emitting device EL and each of the source electrode 123 and the drain electrode 124. The gate insulating layer 112, the interlayer insulating layer 113, and the via layer 114 may be organic layers that function as an insulating layer in the thin film transistor TFT.

Reference numeral 115 indicates a pixel defining layer, and the organic light-emitting device EL may be formed in an opening of the pixel defining layer 115.

The organic light-emitting device EL may display predetermined image information, by emitting red, green, and blue light, as current flows. The organic light-emitting device EL may include the anode 131, which is connected to the drain electrode 124 of the thin film transistor TFT and receives a positive power voltage from the drain electrode 124, a cathode 133, which covers the entire pixels and supplies a negative power voltage to the organic light-emitting device EL, and an emission layer 132, which is between the anode 131 and the cathode 133 to emit light.

A hole injection layer (HIL), a hole transport layer (HTL), an electron transport layer (ETL), and an electron injection layer (EIL) may be stacked adjacent to the emission layer 132.

For reference, the emission layer 132 may be formed in each pixel to form a single unit pixel that includes pixels that emit red, green, and blue light beams. The emission layers 132 formed in the pixels may be spaced apart from one another. Alternatively, an emission layer may be commonly formed over the entire pixel region, regardless of the location of the pixels. In this case, the emission layer 132 may be formed by stacking a light-emitting substance that emits a red light, a light-emitting substance that emits a green light, and a light-emitting substance that emits a blue light on one another, or by mixing a light-emitting substance that emits a red light, a light-emitting substance that emits a green light, and a light-emitting substance that emits a blue light. Any combination of other various colors that is capable of emitting a white light may be utilized. The flexible panel 100 may further include a color converting layer or a color filter that coverts the white light into a light of a corresponding color.

An encapsulation layer 140 may be formed on the cathode 133 and may include an encapsulation organic layer 141 and an encapsulation inorganic layer 142 that are alternately stacked on each other.

According to the present embodiment, as viewed from FIG. 1, a metal oxide infiltrated layer 110a may be formed on an upper surface of the base organic layer 110, namely, on a surface of the base organic layer 110 that faces the organic light-emitting device EL. The metal oxide infiltrated layer 110a may be formed by infiltrating metal oxide, for example, AlOx, TiOx, ZrOx, or Hf, into a surface according to a sequential vapor deposition method. The metal oxide infiltrated layer 110a may function as a barrier layer that prevents infiltration of moisture and oxygen toward the organic light-emitting device EL.

In the sequential vapor deposition method, a metal oxide infiltrated layer may be formed by diffusing metal oxide of a source gas into a minute empty space of a target organic layer. The sequential vapor deposition method may be conducted by inserting a target into a chamber and injecting a source gas into the chamber.

Accordingly, when the base organic layer 110 is provided on a carrier substrate (not shown) and installed within a chamber and a source gas is injected into the chamber, metal oxide may be diffused and infiltrated into an exposed surface of the base organic layer 110 according to the sequential vapor deposition method, and thus the metal oxide infiltrated layer 110a may be formed.

Thereafter, the buffer layer 111 may be formed on the base organic layer 110 on which the metal oxide infiltrated layer 110a is formed, and the thin film transistor TFT, the organic light-emitting device EL, and the encapsulation layer 140 may be sequentially stacked, thereby forming the flexible panel 100.

Accordingly, even when a separate inorganic layer for preventing infiltration of moisture and oxygen is not included, the metal oxide infiltrated layer 110a formed on a surface of the base organic layer 110a may function as a barrier layer.

Thus, the metal oxide infiltrated layer 110a may effectively prevent moisture or oxygen from being infiltrated from the base organic layer 110 toward the organic light-emitting device EL. In addition, because no separate inorganic layers are included, suitable flexibility may be maintained, and thus flexibility that is necessary for the flexible organic light-emitting display device may be sufficiently secured.

Figure 2:
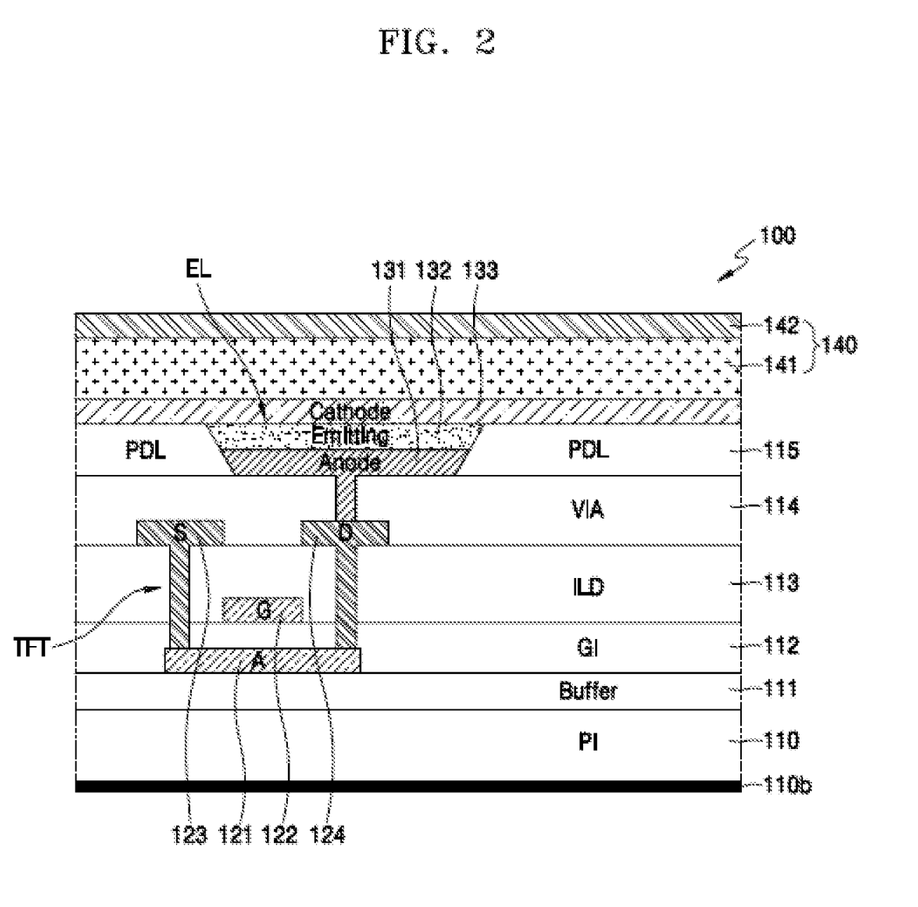
FIG. 2 is a cross-sectional view of a flexible organic light-emitting display according to another exemplary embodiment.

FIG. 2 is a cross-sectional view of a flexible organic light-emitting display device according to another exemplary embodiment.

According to the present exemplary embodiment, a metal oxide infiltrated layer 110b may be formed on a lower surface of the base organic layer 110, namely, on a surface opposite to the surface of the base organic layer 110 that faces the organic light-emitting device EL. Accordingly, according to the previous embodiment, the metal oxide infiltrated layer 110a may be formed on the upper surface of the base organic layer 110, namely, on the surface of the base organic layer 110 that faces the organic light-emitting device EL. However, according to the present embodiment, the metal oxide infiltrated layer 110b may be formed on the surface opposite to the surface of the base organic layer 110 that faces the organic light-emitting device EL. In other words, similar to the embodiment of FIG. 1, the metal oxide infiltrated layer 110b functioning as a barrier layer may be formed on the base organic layer 110. However, in contrast with the embodiment of FIG. 1, the location of the metal oxide infiltrated layer 110b may be on the opposite side.

To this end, the base organic layer 110 may be formed on the carrier substrate (not shown). The buffer layer 111, the thin film transistor TFT, the organic light-emitting device EL, and the encapsulation layer 140 may all be formed on the base organic layer 110, the carrier substrate may then be removed, and the metal oxide infiltrated layer 110b may be formed on an exposed surface of the base organic layer 110 utilizing the sequential vapor deposition method.

Also in the flexible organic light-emitting display device according to the present exemplary embodiment, the metal oxide infiltrated layer 110b may effectively prevent moisture or oxygen from being infiltrated from the base organic layer 110 toward the organic light-emitting device EL. In addition, because no separate inorganic layers are included, suitable flexibility may be maintained, and thus flexibility that is necessary for the flexible organic light-emitting display device may be sufficiently secured.

Figure 3:
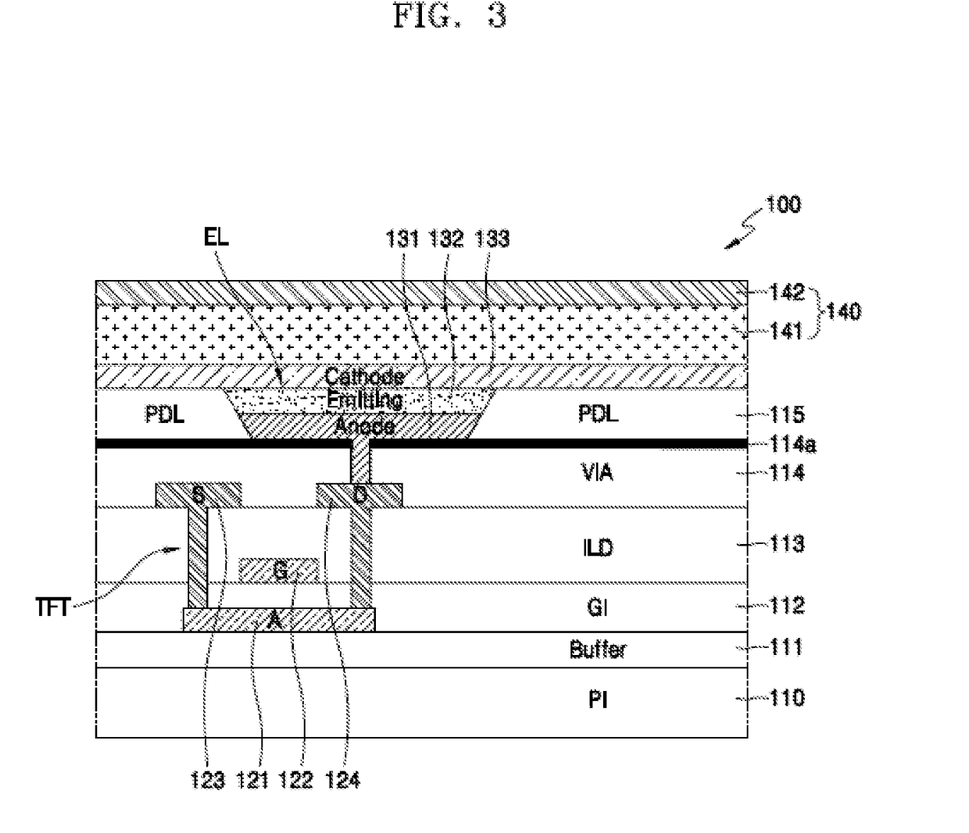
FIG. 3 is a cross-sectional view of a flexible organic light-emitting display according to another exemplary embodiment.

FIG. 3 is a cross-sectional view of a flexible organic light-emitting display device according to another exemplary embodiment. The same reference numerals or characters as those in FIG. 1 denote the same members as those in FIG. 1.

According to the present exemplary embodiment, a metal oxide infiltrated layer 114a may not be formed on the base organic layer 110 but on the via layer 114. Accordingly, according to the embodiments of FIGS. 1 and 2, the metal oxide infiltrated layers 110a and 110a may be formed on the base organic layer 110. However, according to the present embodiment, the metal oxide infiltrated layer 114a may be formed on the via layer 114.

To this end, the buffer layer 111, and the active layer 121, the gate insulating layer 112, the gate electrode 122, the interlayer insulating layer 113, the source electrode 123, the drain electrode 124, and the via layer 114 of the thin film transistor TFT may be formed on the base organic layer 110, and then the metal oxide infiltrated layer 114a may be formed on an exposed surface of the via layer 114 utilizing the sequential vapor deposition method.

Also in the flexible organic light-emitting display device according to the present exemplary embodiment, the metal oxide infiltrated layer 114a of the via layer 114 may effectively prevent moisture or oxygen from being infiltrated from the base organic layer 110 toward the organic light-emitting device EL. In addition, because no separate inorganic layers are included, suitable flexibility may be maintained, and thus flexibility that is necessary for the flexible organic light-emitting display device may be sufficiently secured.

Figure 4:
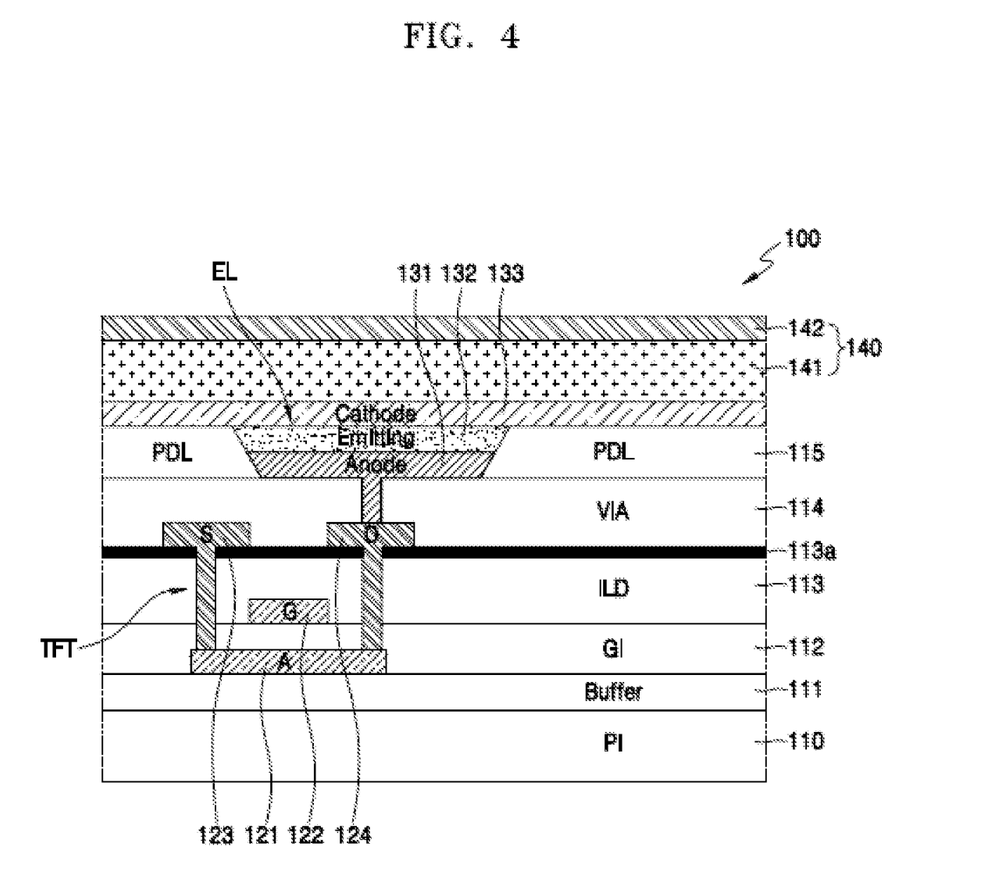
FIG. 4 is a cross-sectional view of a flexible organic light-emitting display according to another exemplary embodiment.

FIG. 4 is a cross-sectional view of a flexible organic light-emitting display device according to another exemplary embodiment. The same reference numerals or characters as those in FIG. 1 denote the same members as those in FIG. 1.

According to the present exemplary embodiment, a metal oxide infiltrated layer 113a is formed on the interlayer insulating layer 113.

To this end, the buffer layer 111, and the active layer 121, the gate insulating layer 112, the gate electrode 122, and the interlayer insulating layer 113 of the thin film transistor TFT may be formed on the base organic layer 110, and then the metal oxide infiltrated layer 113a may be formed on an exposed surface of the interlayer insulating layer 113 according to the sequential vapor deposition method.

Also in the flexible organic light-emitting display device according to the present exemplary embodiment, the metal oxide infiltrated layer 113a of the interlayer insulating layer 113 may effectively prevent moisture or oxygen from being infiltrated from the base organic layer 110 toward the organic light-emitting device EL. In addition, because no separate inorganic layers are included, suitable flexibility may be maintained, and thus flexibility that is necessary for the flexible organic light-emitting display device may be sufficiently secured.

Figure 5:
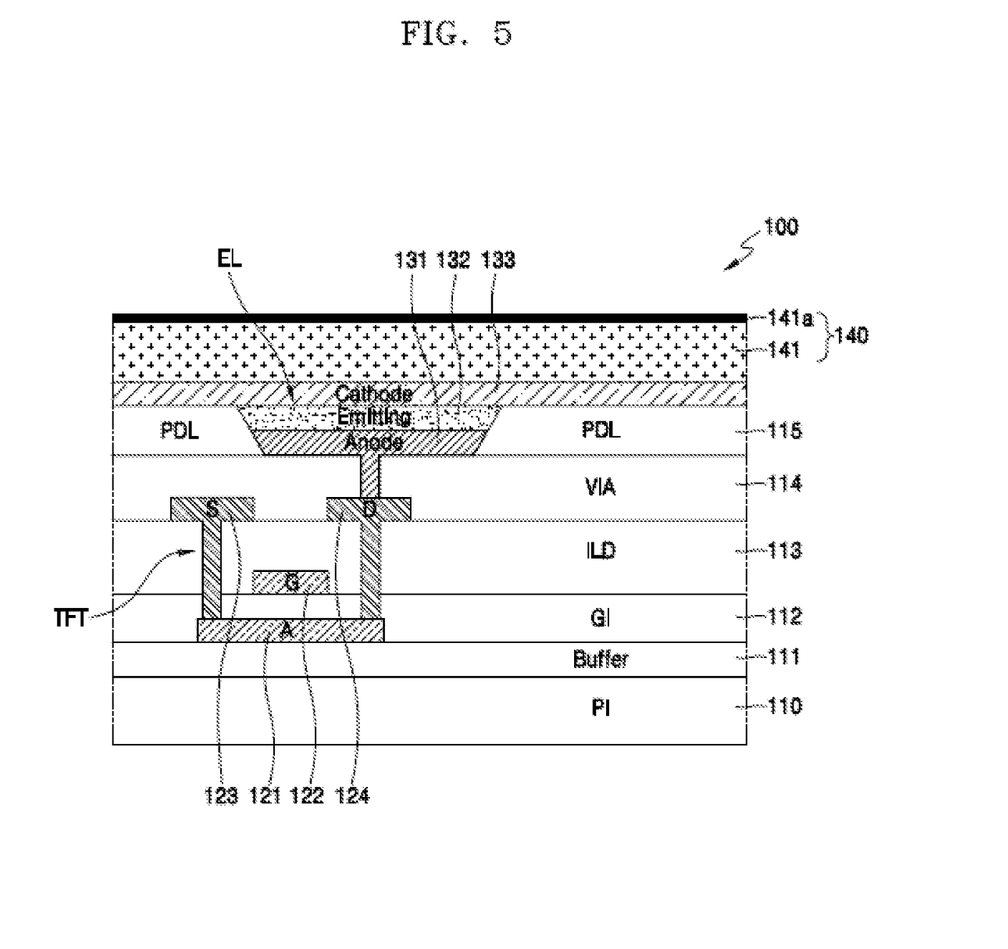
FIG. 5 is a cross-sectional view of a flexible organic light-emitting display according to another exemplary embodiment.

FIG. 5 is a cross-sectional view of a flexible organic light-emitting display device according to another exemplary embodiment. The same reference numerals or characters as those in FIG. 1 denote the same members as those in FIG. 1.

According to the present exemplary embodiment, a metal oxide infiltrated layer 141a may be formed on the encapsulation organic layer 141. The encapsulation organic layer 141 may be typically formed of a monomer material, and the metal oxide infiltrated layer 141a may be formed on an outer surface of the encapsulation organic layer 141.

To this end, the buffer layer 111, the thin film transistor TFT, the organic light-emitting device EL, and the encapsulation organic layer 141 may be sequentially formed on the base organic layer 110, and then the metal oxide infiltrated layer 141a may be formed on the encapsulation organic layer 141 according to the sequential vapor deposition method.

In the flexible organic light-emitting display device according to the present embodiment, the metal oxide infiltrated layer 141a may effectively prevent moisture or oxygen from being infiltrated toward the organic light-emitting device EL via the encapsulation organic layer 141, which is on a side opposite to the side where the base organic layer 110 is located. In addition, because no separate inorganic layers are included and an encapsulation inorganic layer may be omitted, suitable flexibility may be maintained, and thus flexibility that is necessary for the flexible organic light-emitting display device may be sufficiently secured.

Figure 6:
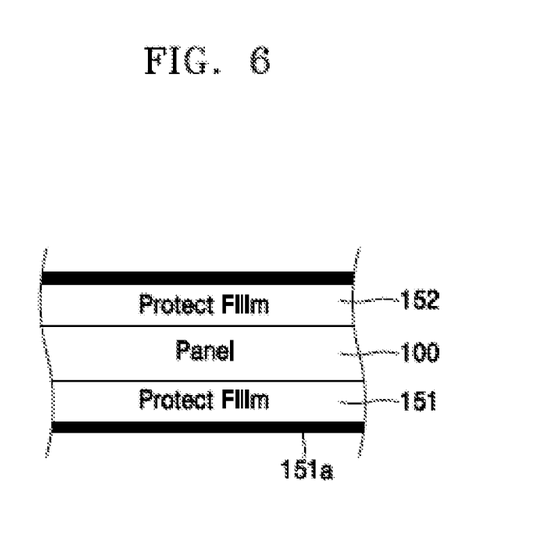
FIG. 6 is a cross-sectional view of a flexible organic light-emitting display according to another exemplary embodiment.

FIG. 6 is a cross-sectional view of a flexible organic light-emitting display device according to another exemplary embodiment. The same reference numeral as those in FIG. 1 denote the same member as those in FIG. 1.

According to the present exemplary embodiment, a metal oxide infiltrated layer 151a may be formed on a protection organic layer 151 from among protection organic layers 151 and 152 may be respectively formed on lower and upper surfaces of the flexible panel 100. A metal oxide infiltrated layer 152a may be originally formed on the protection organic layer 152, and the protection organic layer 152 formed on the protection organic layer 152 may be removed to form a polarization layer 160 of FIG. 7 or a window organic layer 170 of FIG. 7 later. Thus, only the protection organic layer 151 on the side of the base organic layer 110 may remain.

To this end, the protection organic layers 151 and 152 may be respectively formed on the lower and upper surfaces of the flexible panel 100, including from the base organic layer 110 to the encapsulation layer 140, and then the metal oxide infiltrated layers 151a and 152a may be formed on respective surfaces of the protection organic layers 151 and 152 utilizing the sequential vapor deposition method. The protection organic layers 151 and 152 may be attached in the form of adhesive films. As described above, the protection organic layer 152 may be removed for a subsequent process.

Also in the flexible organic light-emitting display device according to the present exemplary embodiment, the metal oxide infiltrated layers 151a of the protection organic layer 151 may effectively prevent moisture or oxygen from being infiltrated from the base organic layer 110 toward the organic light-emitting device EL. In addition, because no separate inorganic layers are included, suitable flexibility may be maintained, and thus flexibility that is necessary for the flexible organic light-emitting display device may be sufficiently secured.

Figure 7:
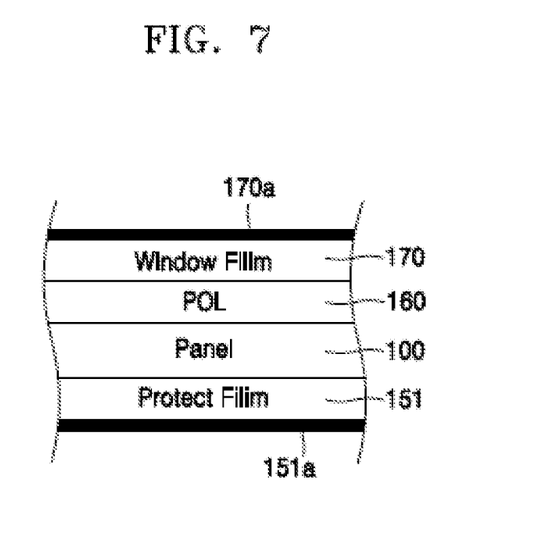
FIG. 7 is a cross-sectional view of a flexible organic light-emitting display according to another exemplary embodiment.

FIG. 7 is a cross-sectional view of a flexible organic light-emitting display device according to another exemplary embodiment. The same reference numeral as those in FIG. 1 denote the same member as those in FIG. 1.

According to the present exemplary embodiment, metal oxide infiltrated layers 151a and 170a may be respectively formed on the protection organic layer 151, formed on the lower surface of the flexible panel 100, and the window organic layer 170 formed on the upper surface of the flexible panel 100.

To this end, the protection organic layer 152 may be removed from the protection organic layers 151 and 152 of FIG. 6 respectively on the lower and upper surfaces of the flexible panel 100, the polarization layer 160 and the window organic layer 170 may be formed, and then the metal oxide infiltrated layers 151a and 170a may be simultaneously formed on respective surfaces of the protection organic layer 151 and the window organic layer utilizing the sequential vapor deposition method. In other words, the flexible organic light-emitting display device according to the present exemplary embodiment shows that, even when a window is also formed using the window organic layer 170 formed of non-glass material, such as a polyurethane material, the metal oxide infiltrated layer 170a may be formed on the window organic layer 170 like the metal oxide infiltrated layer 151a being formed on the protection organic layer 151.

In the flexible organic light-emitting display device according to the present exemplary embodiment, the metal oxide infiltrated layers 151a and 170a may effectively prevent moisture or oxygen from being infiltrated from the window organic layer 170 and the protection organic layer 151 toward the organic light-emitting device EL. In addition, because no separate inorganic layers are included, suitable flexibility may be maintained, and thus flexibility that is necessary for the flexible organic light-emitting display device may be sufficiently secured.

According to a flexible organic light-emitting display device and a method of manufacturing the same as described above, since a function of a barrier layer may be achieved without including a separate inorganic layer, a reliable flexible organic light-emitting display device capable of effectively preventing infiltration of oxygen or moisture without losing flexibility may be realized.

Although embodiments in each of which a metal oxide infiltrated layer is formed on a single organic layer have been illustrated above, the embodiments may be combined. In other words, the embodiments of FIGS. 1 and 2 may be combined to form the metal oxide infiltrated layers 110a and 110b on the upper and lower surfaces of the base organic layer 110, the embodiments of FIGS. 1 and 3 may be combined to form the metal oxide infiltrated layers 110a and 114a on the upper surface of the base organic layer 110 and the via layer 114, and the embodiments of FIGS. 4 and 5 may be combined to form the metal oxide infiltrated layers 113a and 141a on the interlayer insulating layer 113 and the encapsulation organic layer 141. All of the embodiments of FIGS. 1-7 may be combined. Thus, a metal oxide infiltrated layer may be formed on at least one of a plurality of organic layers stacked near (or on and around) an organic light-emitting device EL of a flexible organic light-emitting display device and functions as a barrier layer, thereby effectively preventing infiltration of moisture and oxygen without including a separate inorganic layer.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
    an organic light-emitting device;
    a plurality of organic layers stacked on the organic light-emitting device, the plurality of organic layers comprising an organic insulating material; and
    a metal oxide infiltrated layer which is a part of at least one target organic layer selected from the plurality of organic layers, the metal oxide infiltrated layer including a metal oxide diffused and infiltrated into an exposed surface of the at least one target organic layer according to a sequential vapor deposition method,
    wherein the plurality of organic layers comprise:
        a base organic layer serving as a substrate,
        an insulation organic layer of a thin film transistor that is connected to the organic light-emitting device, and
        an encapsulation organic layer on a second side of the organic light-emitting device, which is opposite to a first side of the organic light-emitting device where the base organic layer is located,
    wherein the encapsulation organic layer covers the organic light-emitting device,
    wherein the thin film transistor comprises:
        an active layer disposed on the base organic layer,
        a gate insulating layer covering the active layer,
        a gate electrode disposed on the gate insulating layer and facing the active layer,
        an interlayer insulating layer covering the gate electrode,
        a source electrode and a drain electrode disposed on the interlayer insulating layer to be respectively connected to different portions of the active layer, and
        a via layer covering the source electrode and the drain electrode, and
    wherein the insulation organic layer comprises the gate insulating layer, the interlayer insulating layer, and the via layer.

2. The display device of claim 1, wherein the metal oxide infiltrated layer is a part of the base organic layer.

3. The display device of claim 2, wherein the metal oxide infiltrated layer is a part of a surface of the base organic layer that faces the organic light-emitting device.

4. The display device of claim 2, wherein the metal oxide infiltrated layer is a part of a second surface of the base organic layer, which is opposite from a first surface of the base organic layer facing the organic light-emitting device.

5. The display device of claim 1, wherein the metal oxide infiltrated layer is a part of the via layer.

6. The display device of claim 1, wherein the metal oxide infiltrated layer is a part of the interlayer insulating layer.

7. The display device of claim 1, wherein the metal oxide infiltrated layer is a part of the encapsulation organic layer.

8. The display device of claim 1, further comprising a protection organic layer on an outer surface of the base organic layer, wherein the metal oxide infiltrated layer is a part of the protection organic layer.

9. The display device of claim 1, further comprising a window organic layer on the encapsulation organic layer,
    wherein the metal oxide infiltrated layer is a part of the window organic layer.

10. A method of manufacturing a display device, the method comprising:
    stacking a plurality of organic layers on an organic light-emitting device, the plurality of organic layers comprising an organic insulating material; and
    forming a metal oxide infiltrated layer as a part of a surface of at least one target organic layer selected from the plurality of organic layers utilizing a sequential vapor deposition method, the metal oxide diffused and infiltrated into an exposed surface of the at least one target organic layer according to the sequential vapor deposition method,
    wherein stacking the plurality of organic layers comprises:
        providing a base organic layer serving as a substrate,
        forming an insulation organic layer of a thin film transistor that is formed to be connected to the organic light-emitting device,
        forming an encapsulation organic layer on a side opposite to a side where the base organic layer is located, and
        forming a protection organic layer on an outer surface of the base organic layer that is opposite the insulation organic layer,
    wherein the encapsulation organic layer covers the organic light-emitting device,
    wherein forming the thin film transistor comprises:
        disposing an active layer on the base organic layer,
        forming a gate insulating layer to cover the active layer,
        disposing a gate electrode on the gate insulating layer and facing the active layer,
        forming an interlayer insulating layer to cover the gate electrode,
        disposing a source electrode and a drain electrode on the interlayer insulating layer to be respectively connected to different portions of the active layer, and
        forming a via layer to cover the source electrode and the drain electrode, and
    wherein the insulation organic layer comprises the gate insulating layer, the interlayer insulating layer, and the via layer.

11. The method of claim 10, wherein the metal oxide infiltrated layer is formed on a surface of the base organic layer that faces the organic light-emitting device.

12. The method of claim 10, wherein the metal oxide infiltrated layer is formed as a part of a first surface of the based organic layer, which is opposite from a second surface of the base organic layer facing the organic light-emitting device.

13. The method of claim 10,
wherein the metal oxide infiltrated layer is formed as a part of the via layer.

14. The method of claim 10,
wherein the metal oxide infiltrated layer is formed as a part of the interlayer insulating layer.

15. The method of claim 10, wherein the metal oxide infiltrated layer is formed as a part of the encapsulation organic layer.

16. The method of claim 10,
wherein the metal oxide infiltrated layer is formed as a part of the protection organic layer.

17. The method of claim 10, further comprising forming a window organic layer on the encapsulation organic layer, wherein the metal oxide infiltrated layer is formed as part of the window organic layer.

\* \* \* \* \*